United States Patent
Heinrichs et al.

(10) Patent No.: US 10,420,246 B2
(45) Date of Patent: Sep. 17, 2019

(54) MODULAR COMPUTER SYSTEM AND SERVER MODULE

(71) Applicant: FUJITSU LIMITED, Kawasaki-shi, Kanagawa (JP)

(72) Inventors: Hans-Jürgen Heinrichs, Munich (DE); Walter Unruh, Munich (DE)

(73) Assignee: FUJITSU LIMITED, Kawasaki (JP)

( * ) Notice: Subject to any disclaimer, the term of this patent is extended or adjusted under 35 U.S.C. 154(b) by 6 days.

(21) Appl. No.: 15/406,908

(22) Filed: Jan. 16, 2017

(65) Prior Publication Data

US 2017/0127550 A1    May 4, 2017

Related U.S. Application Data

(63) Continuation of application No. PCT/EP2015/070264, filed on Sep. 4, 2015.

(30) Foreign Application Priority Data

Sep. 9, 2014   (DE) .................. 10 2014 112 943

(51) Int. Cl.
| | | |
|---|---|---|
| *H05K 7/14* | (2006.01) | |
| *G06F 15/177* | (2006.01) | |
| *G06F 15/78* | (2006.01) | |

(52) U.S. Cl.
CPC ......... *H05K 7/1489* (2013.01); *G06F 15/177* (2013.01); *G06F 15/7864* (2013.01);
(Continued)

(58) Field of Classification Search
CPC ..................... H05K 7/1489; H05K 7/1498
See application file for complete search history.

(56) References Cited

U.S. PATENT DOCUMENTS

| 7,480,303 B1 | 1/2009 | Ngai |
|---|---|---|
| 7,533,210 B2 | 5/2009 | Chatterjee et al. |

(Continued)

FOREIGN PATENT DOCUMENTS

| DE | 102009037567 | 2/2011 |
|---|---|---|
| DE | 102011017386 | 10/2012 |

(Continued)

OTHER PUBLICATIONS

DEOA—Office Action dated Sep. 13, 2017 for German patent application No. 102014112943.1, with English translation. ** References cited in the DEOA were previously filed in the IDS on Jan. 16, 2017.

(Continued)

*Primary Examiner* — Hoa C Nguyen
*Assistant Examiner* — Keith DePew
(74) *Attorney, Agent, or Firm* — Fujitsu Patent Center

(57) ABSTRACT

The invention relates to a modular computer system (1), comprising a chassis (2) having a plurality of receiving bays (7) for receiving corresponding function modules (13), in particular server modules (22). The modular computer system (1) comprises a non-volatile memory device arranged in the chassis (2) and at least one controller arranged in the chassis (2) and connected to the memory device. Here, the memory device is configured to store configuration data of a plurality of function modules (13). The memory device is configured to receive requests to write, read and/or delete configuration data received by a function module (13) accommodated in a receiving bay (7), to map the requests on an address space of the memory device and to transmit corresponding control commands to the memory device. The invention further relates to a server module (22) for use in such a modular computer system (1).

20 Claims, 10 Drawing Sheets

Figure 4:
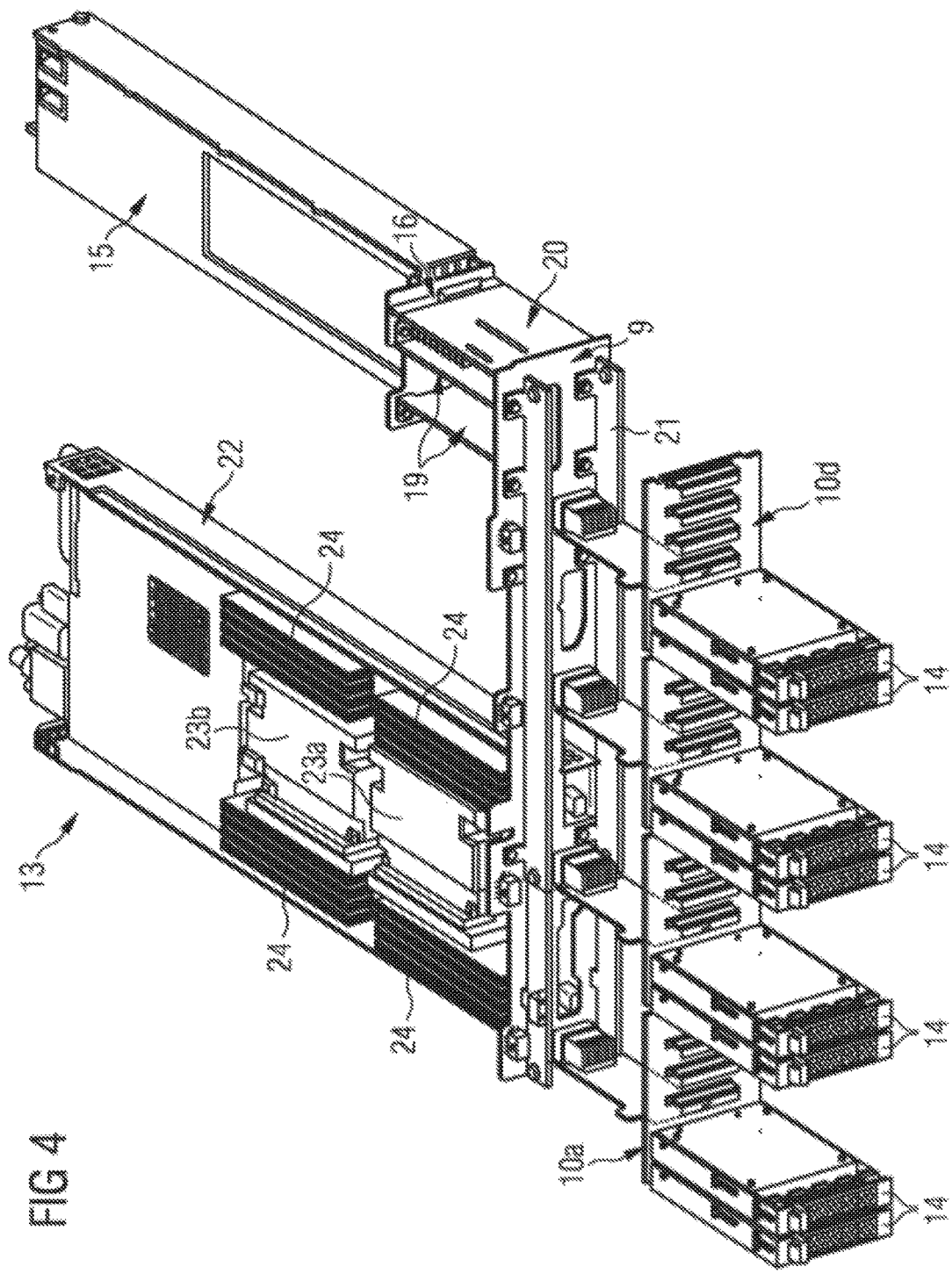

(52) U.S. Cl.
CPC ......... *H05K 7/1438* (2013.01); *H05K 7/1487* (2013.01); *H05K 7/1488* (2013.01); *H05K 7/1498* (2013.01)

(56) References Cited

U.S. PATENT DOCUMENTS

| | | | |
|---|---|---|---|
| 7,738,242 | B2 | 6/2010 | McGraw et al. |
| 7,844,768 | B2 | 11/2010 | Tanaka |
| 8,769,188 | B2 | 7/2014 | Tu et al. |
| 9,568,961 | B1 * | 2/2017 | Huang ................... G06F 1/185 |
| 9,594,641 | B2 * | 3/2017 | Chao ................... H05K 7/1498 |
| 10,139,878 | B2 * | 11/2018 | Munjal ................... G06F 1/263 |
| 2005/0015531 | A1 | 1/2005 | Yabuta et al. |
| 2005/0050272 | A1 | 3/2005 | Behrens et al. |
| 2005/0283549 | A1 | 12/2005 | Gibson et al. |
| 2006/0095595 | A1 | 5/2006 | Dalton et al. |
| 2008/0222310 | A1 | 9/2008 | Karstens |
| 2008/0232974 | A1 | 9/2008 | Tsuchiya |
| 2009/0276613 | A1 * | 11/2009 | Huang ................ G06F 15/7803 713/2 |
| 2011/0069441 | A1 | 3/2011 | Killen et al. |
| 2011/0225537 | A1 | 9/2011 | Wang et al. |
| 2012/0005388 | A1 | 1/2012 | Hsieh et al. |
| 2012/0123597 | A1 | 5/2012 | Cepulis et al. |
| 2013/0102237 | A1 | 4/2013 | Zhou et al. |
| 2013/0170134 | A1 | 7/2013 | Shih et al. |
| 2013/0258582 | A1 | 10/2013 | Shelnutt et al. |
| 2013/0288588 | A1 | 10/2013 | Shih et al. |
| 2013/0346667 | A1 | 12/2013 | Stroud et al. |
| 2014/0073234 | A1 | 3/2014 | Elison et al. |
| 2014/0365641 | A1 | 12/2014 | Cho et al. |
| 2015/0058506 | A1 * | 2/2015 | Muhsam ............... G06F 13/409 710/104 |
| 2016/0353599 | A1 | 12/2016 | Bailey et al. |

FOREIGN PATENT DOCUMENTS

| | | | |
|---|---|---|---|
| DE | 102011118058 | 5/2013 | |
| WO | 2013/068250 | 5/2013 | |
| WO | WO2013068250 a1 * | 5/2013 | ......... G06F 13/4027 |

OTHER PUBLICATIONS

Jedrak M. et al., "NAND Flash memory in embedded systems", 2012 (10 pages).

USPTO, [Wang] Final Rejection dated Nov. 2, 2018 for related U.S. Appl. No. 15/445,068 [pending]. **Remaining references listed in the Office Action were previously in the Non-Final Rejection dated May 3, 2018.

USPTO, [Wang] Advisory Action dated Feb. 6, 2019 for related U.S. Appl. No. 15/445,068 [pending].

DEOA—English translation of Office Action dated Aug. 6, 2015 for German Patent Application No. 102014112943.1. * U.S. Pat. No. 8,769,188, WO2013/068250 and Non-patent literature by JEDRAK cited in the DEOA were previously submitted in the IDS filed on Jan. 16, 2017.

Hitachi Semiconductor (America) Inc., Leonard Haile, "Interfacing the H8/3644 to a Serial E2PROM; How to use the SCI Interface to emulate an SPI interface", Revision 1.1, Aug. 4, 1998. (32 pages).

USPTO, [Wang], CTNF—Non-Final Rejection dated May 3, 2018 in related U.S. Appl. No. 15/445,068 [pending].

USPTO, [WANG] Non-Final Rejection dated Jul. 2, 2019 for related U.S. Appl. No. 15/445,068 [pending]. ** Reference US2016/0353599 listed in the attached Office Action was previously submitted in the Supplemental IDS filed on Jun. 18, 2019.

* cited by examiner

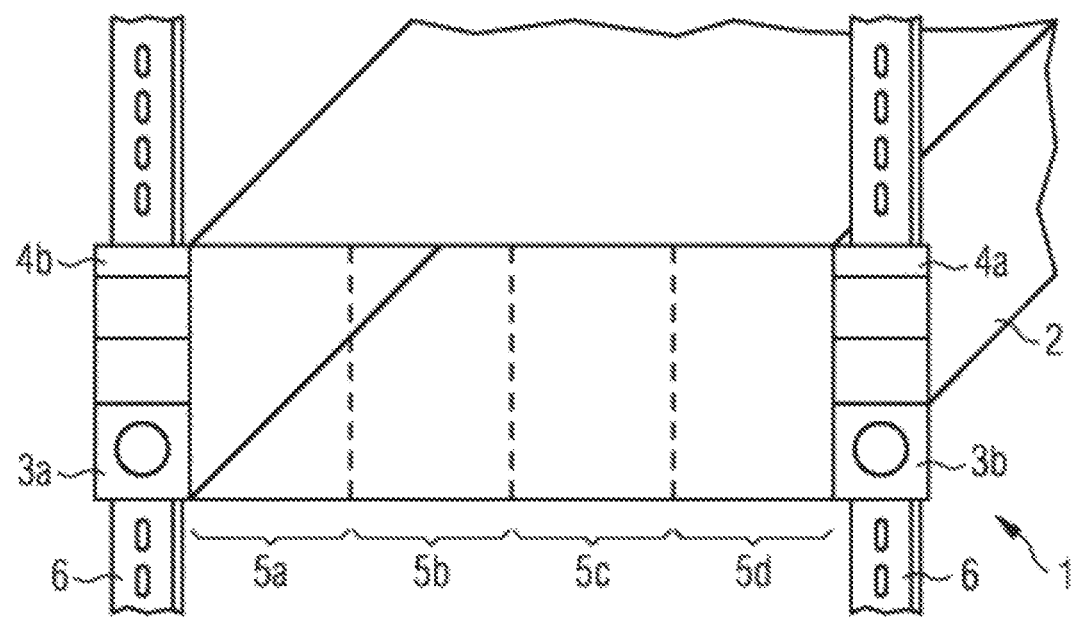
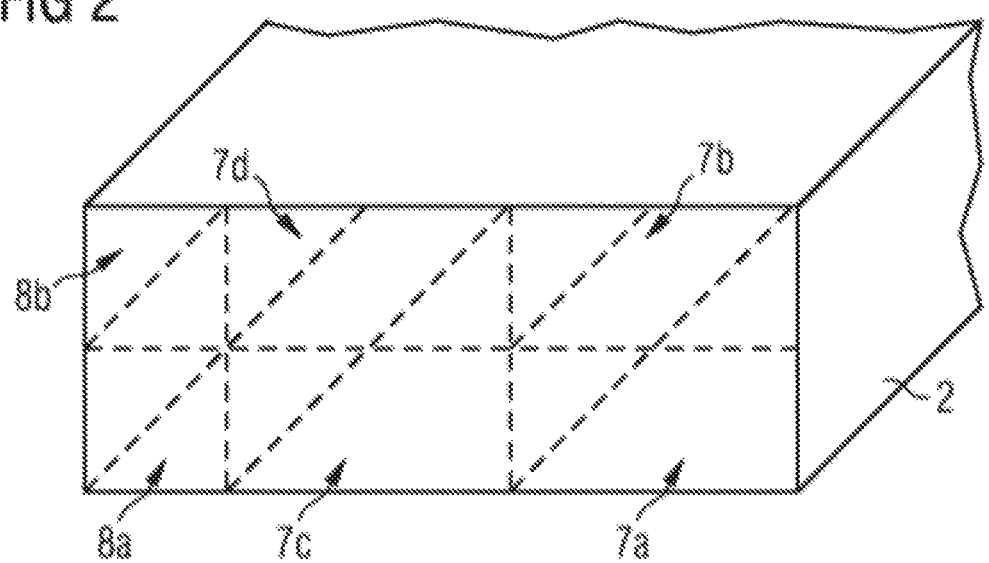

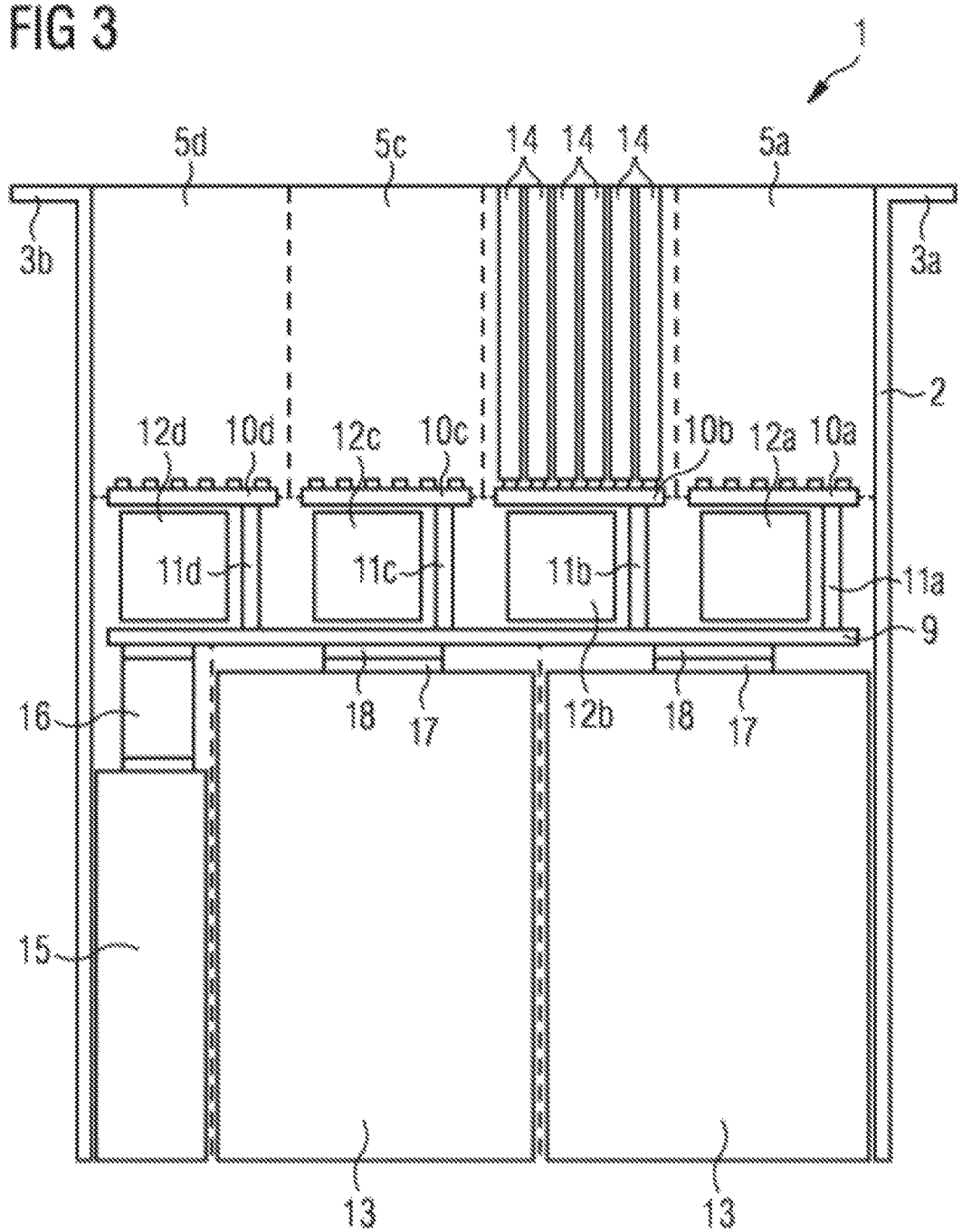

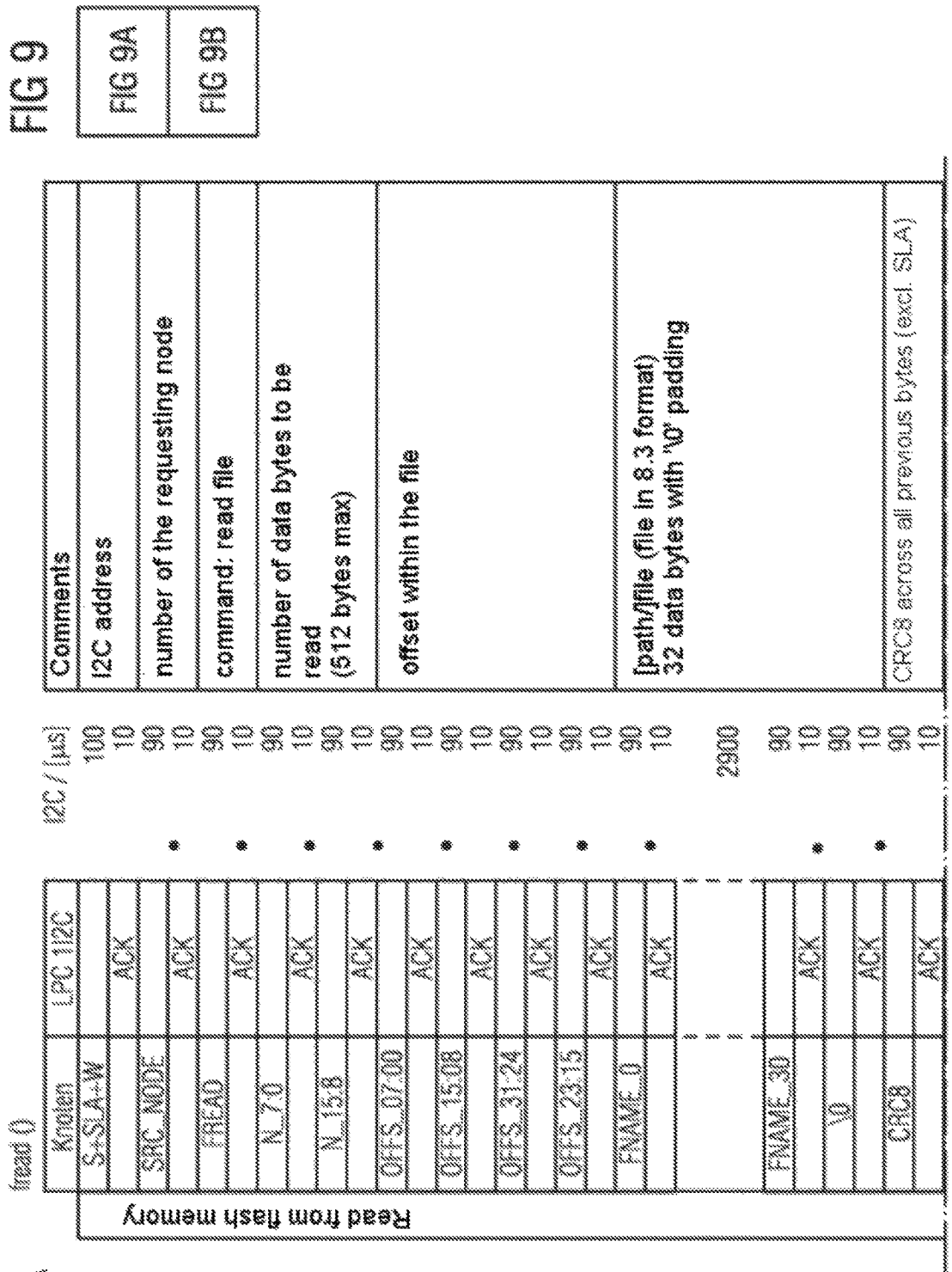

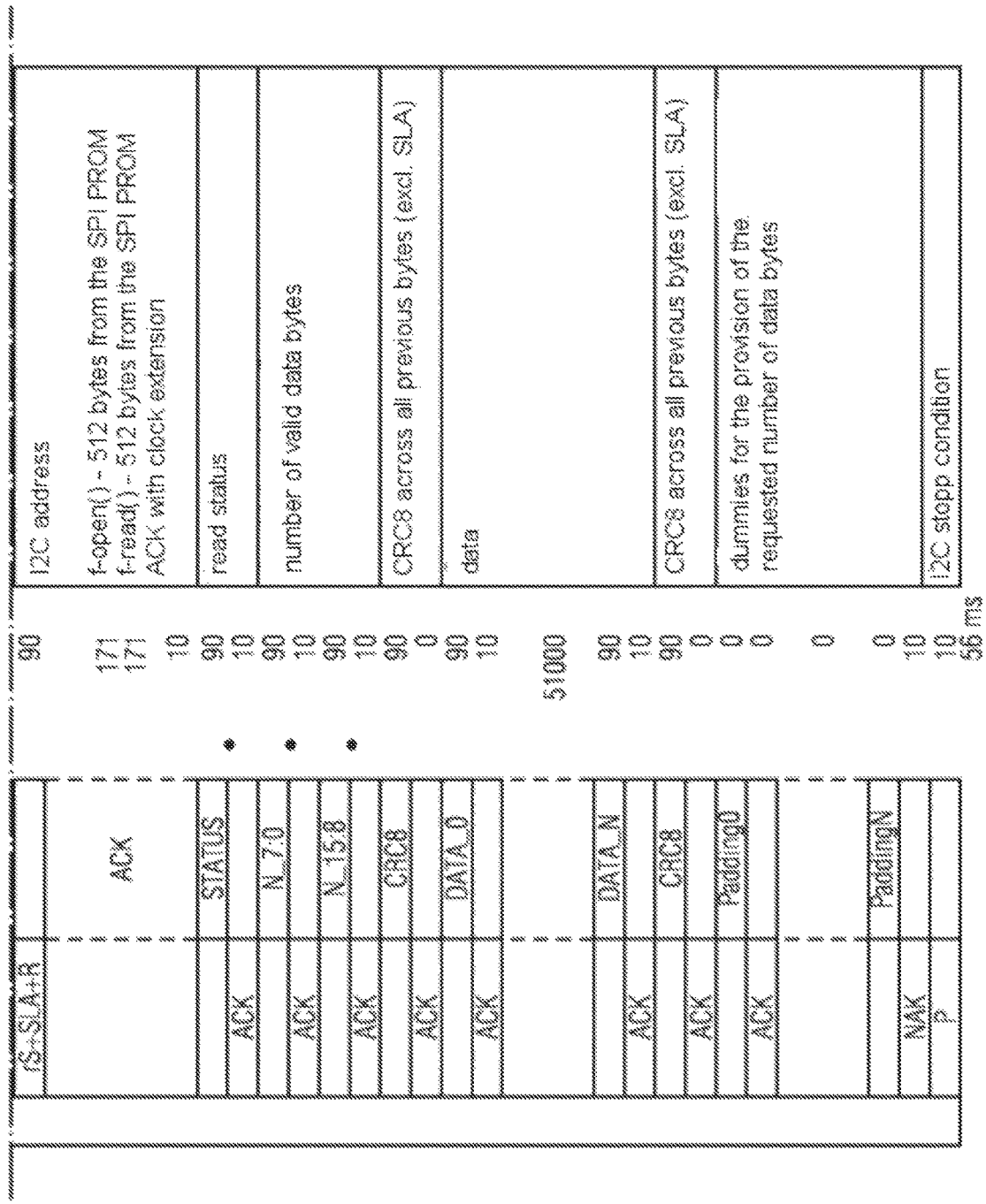

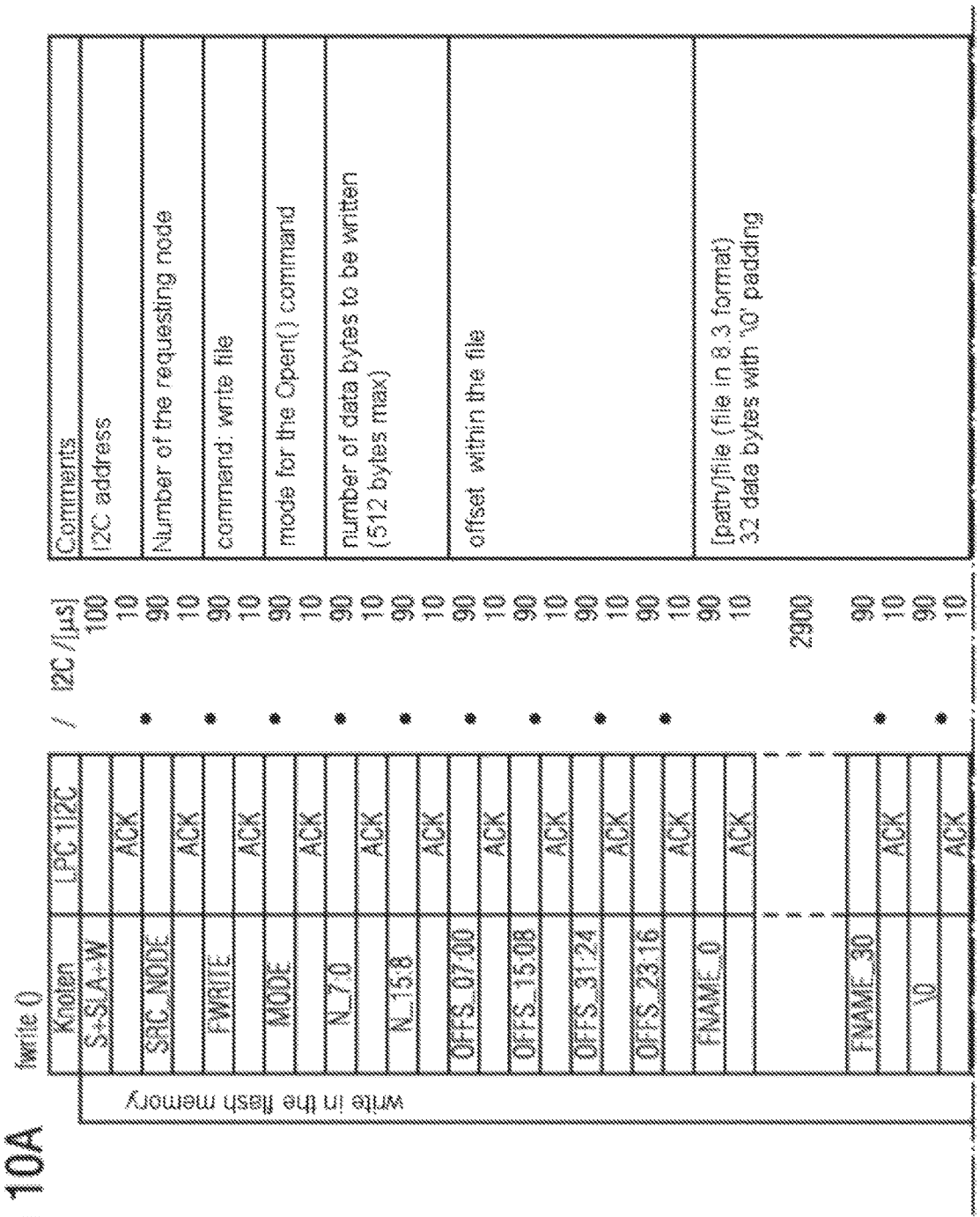

MODULAR COMPUTER SYSTEM AND SERVER MODULE

CROSS-REFERENCE TO RELATED APPLICATION

The present application is a continuation application filed under 35 U.S.C. 111(a) claiming benefit under 35 U.S.C. 120 and 365(c), of PCT International Application No. PCT/EP2015/070264, filed Sep. 4, 2015, which is based upon German Patent Application No. DE102014112943.1, filed Sep. 9, 2014, the entire contents of which are incorporated herein by reference.

The invention relates to a modular computer system comprising a chassis with a plurality of receiving bays for receiving corresponding function modules, in particular server modules. The invention further relates to a server module for a modular computer system and a rack assembly with at least one modular computer system accommodated as a rack plugin in the rack housing.

With the increasing global demand for IT services the demand for computing performance continues to increase. In addition to only providing computing performance, the associated space and energy requirement also plays an important role. This concerns relatively small server assemblies, as can be found for example in IT departments of SMEs, as well as in computing centers in big companies or specialized IT service providers.

In order to expand the necessary computing performance, different approaches are known from prior art for the structure of expandable computer systems. A relatively simple approach is to integrate server computers into server racks with a standard form factor, typically a 19-inch rack, and supplement respective server racks with further server computers according to the demand. The individual server computers work relatively independently here. In particular, such server computers have individual power supplies and network interfaces. Such systems are comparatively cost-effective, but require a relatively large amount of space and administration effort.

An alternative approach is the integration of individual, so-called blade servers into a blade server system. Here, in addition to the actual blade servers having processors and main storage arranged thereon, a blade system comprises a number of infrastructure components such as power supplies, network switches, network interfaces and mass storage units, that the individual blade servers access as shared resources. In addition, each blade system typically comprises one or several so-called management blades, which is/are used to monitor, manage and administer the remaining components. Blade server systems allow for high computing density, but are relatively expensive. This is due, inter alia, to the plurality of special components required to build a functional blade server system.

In a third approach, which is, inter alia, referred to as a modular computer system or as a multi-node computer system, a plurality of server modules is accommodated in a common chassis. Since the server modules partially do not have an individual, separate housing, they are sometimes referred to as a "skinless" server. The individual server modules can be connected via the chassis with a common power supply, cooling, and similar simple or standardized components, such as hard disk drives, wherein the server modules per se constitute largely independent server computers.

In particular, such modular computer systems do not require a central management entity, as is common, for example, in blade server systems. They allow for high computing density at a relatively low cost of the overall system.

A modular computer system of the type described above is known, for example, from the international application WO 2013/068250 A1. The server system disclosed therein comprises at least one circuit board arranged in the chassis for contacting server plugins accommodated in plug-in slots, wherein the circuit board comprises at least one first microcontroller. The server system further comprises a server plugin arranged in the first plug-in slot and a first server slot coupled with at least one circuit board, wherein the first server slot has a first system management controller. The first microcontroller and the first system management controller are coupled to one another via at least one first signal line, and the first microcontroller is configured to provide at least one chassis-specific configuration value to the system management controller. The mentioned assembly particularly allows for indirect access to chassis-specific configuration data of the server system via a network and a system management controller of a single server plugin without the chassis per se having a network interface.

In such computer systems, one challenge is to simplify or improve the use of system components provided via the chassis, in order to improve integration of the modular computer system. At the same time, the structure of the chassis itself or of the components installed therein should be kept as simple as possible in order to limit their price and complexity.

Against this background, the present application describes a modular computer system, comprising a chassis with a plurality of receiving bays for receiving corresponding function modules, in particular server modules. The computer system comprises a non-volatile memory device which is arranged in the chassis and at least one controller which is arranged in the chassis and is connected to the memory device. The memory device is configured to store configuration data of a plurality of function modules and the controller is configured to receive, from a function module accommodated in a receiving bay, requests to write, read, and/or delete configuration data, to map the requests on an address space of the memory device, and to transmit corresponding control commands to the memory device.

The aforementioned features allow for shared use of a memory device of the chassis of the modular computer system via a plurality of function modules, in particular server modules. This way, the controller interconnected between the individual function modules and the memory device can map the requests of the individual function modules on one or more address spaces of the memory device, so that no conflict regarding the stored data results.

According to at least one embodiment, each of the receiving bays has at least one electrical connection that is electrically connected to the controller for the electrical contacting of a function module accommodated in the respective receiving bay. In this case, the controller is connected via a first serial bus system to the terminals for the transmission of configuration data to function modules arranged in the receiving bays, and the first serial bus system is configured to prevent the simultaneous transmission of configuration data by different function modules. By using a serial bus system, the number of lines required for data transmission can be kept small. By using measures for bus arbitration, conflicts upon accessing the controller can be avoided.

In at least one embodiment, the memory device provides a plurality of memory blocks for storing data. The controller provides a file system for accessing the memory device by means of path and/or file names and is configured to map the received path and/or file names received from the function modules accommodated in the receiving bays on the blocks of the memory device assigned to the path and/or file names. By providing a file system, the individual function modules can access stored data using logical file names, in particular path names and file names, without knowing the address scheme of the memory device. In addition, this allows for a targeted exchange of data between different function modules.

In at least one embodiment, the controller implements a protocol for accessing the configuration data stored in the file system by function modules accommodated in the receiving bays, wherein the protocol ensures atomic access to individual elements of the file system. By using a protocol with atomic operations, a consistency of stored data, in particular the consistency of the file system per se, can be ensured.

In at least one embodiment, the memory device comprises a programmable read only memory, in particular a flash memory, whose memory cells have a first logic value in the unprogrammed state. Here, the controller is configured to invert data bits of configuration data received in the function modules accommodated in the receiving bays, so that data bits of the received configuration data are mapped with a second logic value on memory cells of the memory device in the unprogrammed state. By inverting bits of data, in particular differences between conventions used in known file systems and physical memory devices can be balanced, such as in particular a flash memory, in order to reduce the number of required programming operations.

In at least one embodiment, the programmable read only memory can be erased only in blocks, and the controller has a buffer for buffering at least one data block of the programmable read only memory. Upon receipt of a request for writing configuration data, the controller is configured to load into the buffer the configuration data contained in the request and/or a storage block assigned to the request from the memory device to compare the configuration data to be written with the data from the assigned memory block and to discard the request for writing of configuration data without intermediate deletion or writing of the configuration data to be written, if the comparison has revealed that the buffered data block identically contains the configuration data to be written. By means of an analysis whether the data to be re-written contains an excess of the data already stored, a write operation can be completely dispensed with under certain circumstances.

In at least one further embodiment, the controller is further configured to overwrite the assigned data block with the configuration data without intermittent deletion, if the comparison has shown that exclusively transitions from the first logic value corresponding to the unprogrammed state to the second logic value corresponding to a programmed state for writing the configuration data into the programmable read-only memory are necessary. Furthermore, the controller is configured to delete the assigned data block and subsequently to write thereon the configuration data to be written thereon, if the comparison showed that at least one transition from the second logic value to the first logic value is necessary for writing configuration data to the programmable read only memory. By the mentioned steps, a number of delete operations of a programmable read only memory, in particular of a flash memory, can be further reduced.

According to another aspect of the present invention, a server module for use in a modular computer system with a controller and a memory device, particularly the above-mentioned computer system is provided. The server module comprises at least one system board for accommodating system components, at least one module connector for the electrically contacting of the modular computer system, and at least one firmware component for storing and retrieving configuration data. In this case, the at least one firmware component is configured to transmit configuration data to be stored via the module connection to the controller of the modular computer system and to retrieve configuration data to be retrieved via the module connection from the controller of the modular computer system. By transmitting or retrieving configuration data via a module connection of a server module, providing a module-internal memory, in particular a flash memory for storing configuration data, can be dispensed with.

In at least one embodiment, the server module comprises at least one system management module, wherein the system management module is connected to the module connector via a serial system management bus. The system management module is configured to execute the at least one firmware component to exchange configuration data via the system management bus with the controller. By using a system management component, which is typically connected to most components of a server module via a system management bus, the data exchange of configuration data can be implemented without additional hardware components on the part of the server module.

Further advantageous embodiments are disclosed in the appended patent claims and the following detailed description of an exemplary embodiment.

Figure 5:
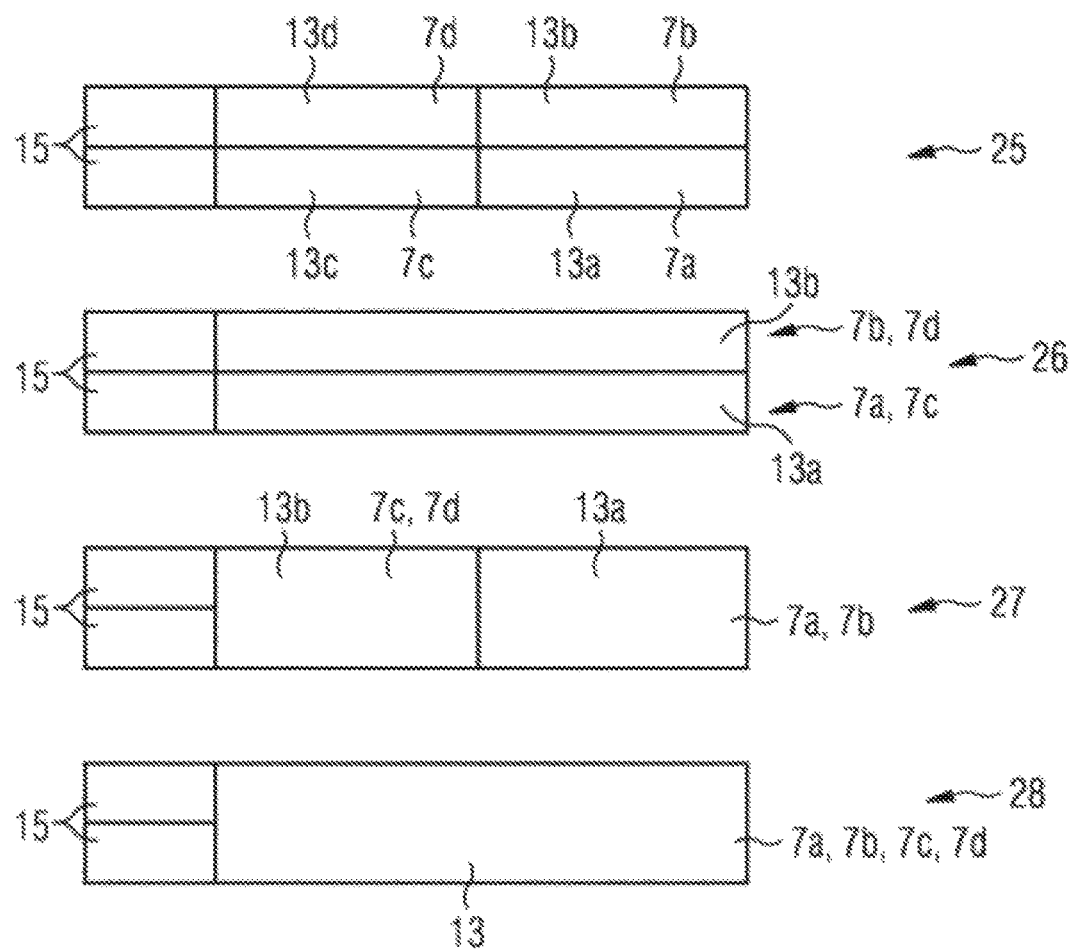
Figure 6:
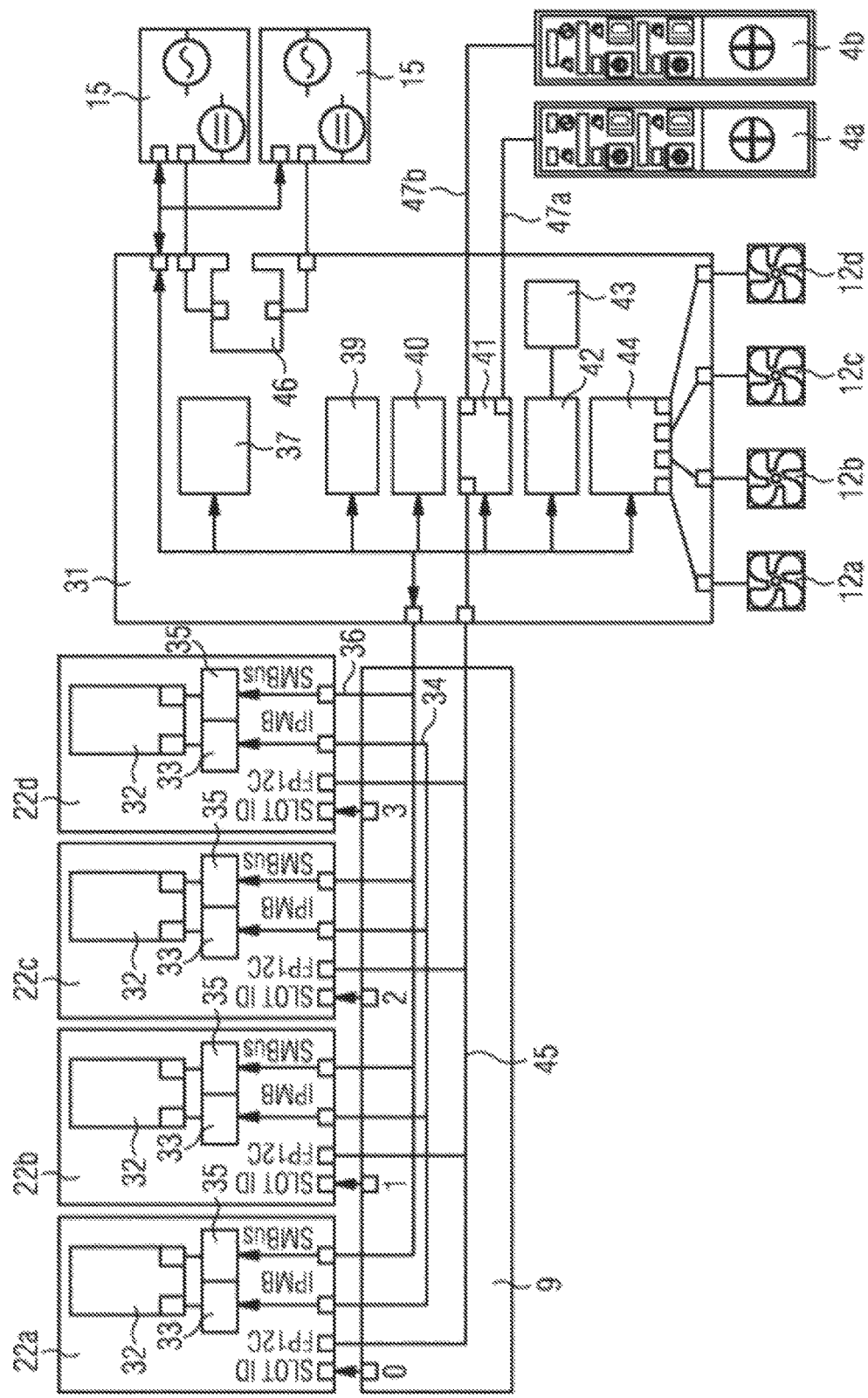
Figure 7:
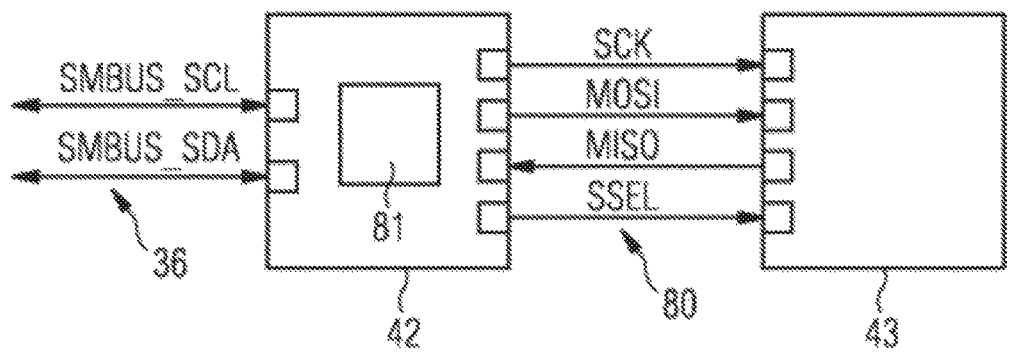
Figure 8:
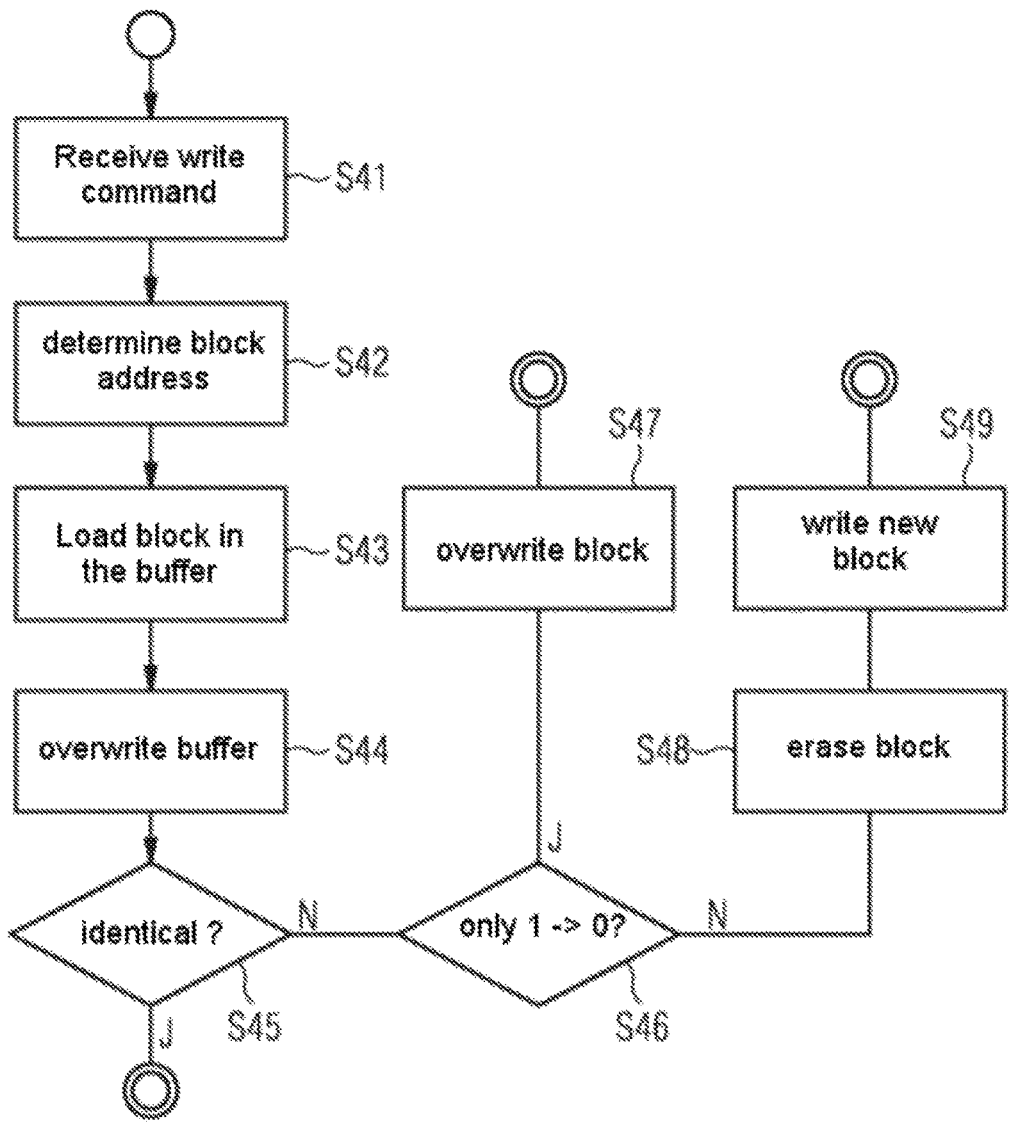
Figure 10B:
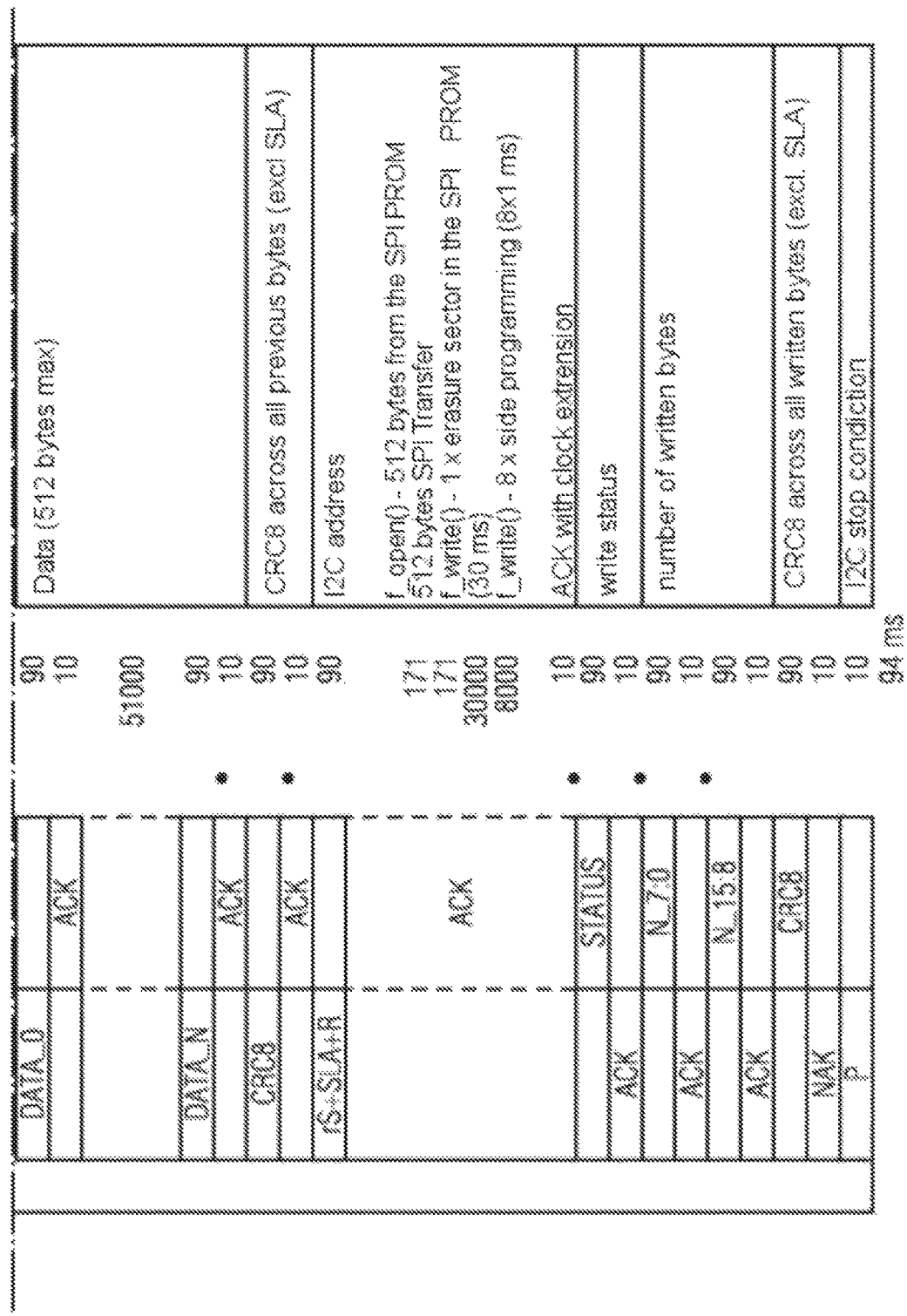

The invention is described in detail below by means of an exemplary modular computer system with reference to the appended Figures. In the Figures and the description, individual instances of similar components are distinguished from one another by an alphabetical suffix. If no suffix is specified, all components are referred to, respectively. The Figures show in:

FIG. 1 a perspective front view of a chassis of a modular computer system,

FIG. 2 a perspective rear view of the chassis according to FIG. 1,

FIG. 3 a schematic illustration of the system structure of the modular computer system, FIG. 4 a perspective view of different functional units of the modular computer system, FIG. 5 a schematic illustration of different configurations of the modular computer system, FIG. 6 a schematic illustration of the connection of function modules with components of the chassis, FIG. 7 a schematic illustration of the electrical connection of a flash module to a serial bus system of the modular computer system, FIG. 8 a flowchart of a method for writing a data block, FIG. 9 (FIG. 9A and FIG. 9B) a schematic illustration of the sequence of a reading operation and FIG. 10 (FIG. 10A and FIG. 10B) a schematic representation of the sequence of a write operation.

Before discussing the details of the solution according to the invention, will first be described using FIGS. 1 to 5 of the general system structure of a modular computer system according to the exemplary embodiment used herein. The computer system described is a so-called multi-node system, in which a plurality of server modules largely operating logically independently from one another are arranged in a common chassis.

FIG. 1 shows a perspective front view of a chassis 2 for such a modular computer system 1. In the exemplary embodiment, chassis 2 corresponds to a standard size, in particular a 19-inch rack format for insertion into a corresponding rack housing. To that end, the chassis 2 has on the front side two fastening tabs 3a and 3b, with which the chassis 2 is fixed to the vertical perforated rails 6 of the rack housing (not shown here). Thumb screws or other known fasteners may be used for fastening, for example. The chassis 2 according to FIG. 1 has a construction height of two so-called height units respectively of 44.45 millimeters. Of course, it is also possible to use other construction heights for accommodating bigger or different components than those described below.

To make optimal use of the available area that can be reached from the front side of the rack housing, control panels 4a and 4b are arranged on the fastening straps 3a and 3b that display different control data or serve to the input of control data. In the exemplary embodiment, the space available between the control panels 4a and 4b serves to accommodate storage plugins of a standard size, in particular hard drive modules. In the exemplary embodiment shown, a total of 24 hard drive modules with hard disk drives in the 2.5-inch format, which are divided into four groups 5a to 5d of storage plugins, can be arranged in the central area.

The described modular computer system 1 serves to accommodate up to four individual function modules, in particular server modules, in corresponding receiving bays 7a to 7d. The function modules are inserted into the chassis 2 from a rear side shown in FIG. 2. Although the individual receiving bays 7a to 7d are shown separated by dashed lines in FIG. 2, it is indicated that a physical separation in the chassis 2 is not required. In this way, in particular, larger function modules can be accommodated in adjacent receiving bays 7a to 7d, as described below in FIG. 5. In a side region of the rear side of the chassis 2 there are two additional receiving bays 8a and 8b for accommodating two corresponding power supplies. These receiving bays are not physically separated from each other, too.

FIG. 3 shows a schematic top view of the system structure of the modular computer system 1. It can be seen that further components are arranged inside of chassis 2 in addition to the above-mentioned components. Chassis 2 in particular comprises a first circuit board 9 arranged perpendicularly to the insertion direction of function module 13. The first circuit board 9 is also sometimes referred to as a midplane, since it is arranged inside a housing and can be contacted from two sides by additional components. The individual function modules 13 and other components of the modular computer system 1 are connected to one another via the first circuit board 9. For the electrical contacting, each of the function modules 13 has a module connection 17, which can be plugged into a corresponding connection 18 of the first circuit board 9.

In addition, in the exemplary embodiment, the modular computer system 1 comprises four second circuit boards 10a to 10d, which are each assigned to one of the groups 5a to 5d of storage plugins 14. Via the second circuit boards 10a to 10d, a group 5 of in each case six storage plugins 14 can be contacted, via standardized SAS or SATA connectors, for example. The four second circuit boards 10a to 10d are connected to the first circuit board 9 via four corresponding circuit board connectors 11a to 11d. The circuit board connectors 11a to 11d per se be circuit boards with corresponding plug connectors.

In the exemplary embodiment, four cooling devices 12a to 12d are arranged between the first circuit board 9 and the second circuit boards 10a to 10d. The cooling devices 12a to 12d are, in each case, double-fan systems, with two single-air feeders arranged behind one another. The cooling devices 12a to 12d suction air from the front through the groups 5a to 5d of storage plugins 14 and blow them out of the chassis 2 by means of function modules 13 and power supply units 15 inserted into the receiving bays 7a to 7d.

Finally, it can be seen in FIG. 3 that the power supply units 15 do not extend over the entire depth between the rear side of the chassis 2 and the first circuit board 9. Therefore a connecting structure 16 is arranged between the power supply units 15 and the first printed circuit board 9 for the electrical contacting, which is in particular suitable for the transmission of large currents.

FIG. 4 shows a perspective view of the various system components of the modular computer system 1 without the assigned chassis 2.

In the illustration according to FIG. 4, the construction of the connecting structure 16 can be seen in detail. Besides two copper plates 19 the connecting structure 16 additionally comprises a third circuit board 20 that connects the control components of the power supply units 15 via a system management bus (not visible in the figure) to further system components from the modular computer system 1. In the exemplary embodiment, copper rails 21 are arranged on the backside of circuit board 9 in order to transmit the electrical energy transmitted via the connecting structure 16 from the power supply units to the function modules 13 accommodated in the receiving bays 7a to 7d.

In addition to the connections required for the connection of the different function modules 13 and/or the storage plugin 14, the first circuit board 9 as well as the second circuit boards 10a to 10d, in each case have openings allowing for ventilation of the components installed inside the chassis 2.

Furthermore, it can be discerned that in the illustrated exemplary embodiment the function module 13 is configured as a server module 22. In the exemplary embodiment, the server module 22 comprises a system board which is concealed in FIG. 4, as well as two processors 23a and 23b arranged thereon, with a total of four associated banks 24. On the rear side of the server module 22 are provided various plug connectors, for connecting the server module 22 to a local data network, for example.

FIG. 5 schematically shows different possibilities for equipping the modular computer system 1 with function modules 13. In a first configuration 25, each of the receiving bays 7a to 7d is equipped with its own function module 13a to 13d, for example a server module 22. In a second configuration 26, only two function modules 13a and 13b with in each case double width, are arranged in two adjacent receiving bays 7a and 7c and 7b and 7d. In a third configuration 27, in each case two function modules 13a and 13b a double construction height are arranged respectively in two superimposed receiving bays 7a and 7b or 7c and 7d. This configuration is particularly flexible as, a server module 22 for example, with an individual construction height can be combined with an additional module, for example a high-performance computing module with one or more graphics processors. Finally, a fourth configuration 28 can be discerned in FIG. 5, in which only an individual function module 13 with a double width and double height fills out all the receiving bays 7a to 7d.

The connection of the individual function modules 13 with further components of chassis 2 is described in detail in the following. At this point, it is understood, that the function modules 13, in particular in the form of server modules 22, operate largely independently of one another. In particular, each of the function modules 13 is connected to its own corresponding group 5 of storage plugins. For external communication, each of the function modules 13 uses its own network interface or another communication interface. Accordingly, standard components can largely be used for the structure of the individual function modules 13. In the configuration as server modules 22, for example, each of the function modules 13 comprises a circuit board configured as a system board having components arranged thereon, such as, for example, processors 23 and banks 24. System administration usually takes place via a data network and a system management module of the individual server modules 22. Therefore, a connection complying with standards of the individual function modules 13 is important for the system integration of the modular computer system 1.

FIG. 6 schematically shows the connection of four server modules 22a to 22d with the various components of chassis 2. As can be taken from FIG. 6, each of the server modules 22a to 22d is connected to the respective other server modules 22a to 22d or to a chassis interface unit 31 via three bus systems 34, 36 and 45.

In particular, so-called system management modules 32, also known as "intelligent remote management controllers" (iRMC), of the server modules 22 are connected to a so-called IPMB bus 34 for communication with neighboring server modules 22 via a first interface module 33. Furthermore, the system management modules 32 are connected to different components of the chassis interface unit 31 via a second interface module 35 and a serial system management bus 36. The system management bus 36 serves in particular for connecting the system management modules 32 to control modules of the power supply units 15, (not illustrated in FIG. 6) an ambient temperature sensor 37, a so-called chassis FRU memory 39 for storing a chassis identification, a capacitor-buffered light path controller 40 for storing and outputting error states via so-called "Customer Self Service" (CSS) LEDs, a first microcontroller 41 for exchanging control data via the control panels 4a and 4b, a second microcontroller 42 for connecting a flash memory 43, and a third microcontroller 44 for controlling the cooling devices 12a to 12d. In addition to the system management bus 36, the server modules 22a to 22d are also connected to the first microcontroller 41 for connection to the control panels 4a and 4b, independently of the system management modules 32 via a further serial bus system 45. Each of the control panels 4a and 4b is connected to the first microcontroller 41 via a further separate serial bus system 47a or 47b.

In the exemplary embodiment, the bus systems 34, 36, 45, 47a and 47b are each configured as serial bus systems. It should be noted that the various serial bus systems 34, 36, 45, 47a and 47b each require only a relatively small number of signal lines of the components connected thereto. Thus, only relatively few lines have to be provided on the first circuit board 9, which in particular improves the ventilation and thus the cooling of the modular computer system 1.

Using methods from the bus parallel access by different function modules 13 to bus systems 34, 36 and 45 are avoided. In the case of the IPMB bus system 34 and of the system management bus 36 the bus masters monitor, how for example the system management modules 32, according to the 12C protocol, whether bus lines are already operated by another bus user while they themselves are transmitting data. If such a collision is detected, the recognizing bus user waits for predetermined period of time, before a transaction is restarted. This ensures that in each case only one transaction takes place on the system management bus 36. For the serial bus systems 45, 47a and 47b, the first microcontroller 41 is the only bus master, so that there do not result any conflicts.

Finally, it can be seen in FIG. 6, that the two power supply units 15 are connected to one another via a dedicated control circuit 46. The control circuit 46, among other things, allows for monitoring of the secondary DC supply voltage provided by the power supply units 15 as well as of a primary grid AC voltage independent from the system management bus 36. The control circuit 46 also requires only a few control lines for connection to the power supply units 15. For example, each of the power supply units 15 has a control line for signaling a failure of the primary supply voltage, a control line for signaling a stable secondary supply voltage, and a third control line for switching on the respective power supply unit 15. The various control lines are requested by the control circuit 46 using a discrete circuit and are forwarded to the individual server modules 22 or are requested by the server modules 22, combined and forwarded to the power supply units 15.

In conventional server systems, configuration data such as BIOS settings and/or network settings, in particular virtual network addresses to be used, are usually stored in one or more so-called chassis PROMS with storage capacities of 64 or 128 kB. By storing in a memory which is independent of the server system board, such settings can, for example, be maintained during the replacement of a system board in the server system. Usually such memory modules are connected by a so-called I²C bus to a system management module of the respective server system. Here, storage access from the system management module are made to a predetermined address range of the chassis PROM, without access by other components interfering with this access. Corresponding memory modules are relatively expensive.

In the described exemplary embodiment, the chassis 2 of the modular computer system 1 allows for storage of configuration data for a plurality of function modules 13 accommodated in the receiving bays 7a to 7d in a single central flash memory 43 arranged on the first circuit board 9 of the chassis 2. As a result, in the modular computer system 1, such settings are maintained even if a function module 13, in particular a server module 22, is replaced by the insertion of another, similar function module 13 into the same receiving bay 7a. At the same time, the proposed solution does not require a separate storage for each function module 13 and/or for each receiving bay 7.

As illustrated in FIG. 7, accesses to the flash memory 43 take place via the second microcontroller 42. Here, the second microcontroller 42 receives requests from the system management modules 32 via the system management bus 36 according to the I²C protocol. The flash memory 43 is a relatively cost-effective flash memory module with a relatively large memory capacity of, for example, 4 MB and an SPI interface of 80. The implementation between the system management bus 36 on the one hand and the SPI interface 80 on the other hand is effected by the microcontroller 42. This allows for the different server modules 22a to 22d and any logical server nodes contained therein to store data in the flash memory 43 while maintaining the conventional I²C protocol.

In order to separate the stored data, the second microcontroller 42 provides a file system for accessing the memory of the flash memory module 43. To that end, it evaluates requests of firmware components of the function modules 13 for path or file names contained therein and implements the corresponding writing, reading or other requests to physical memory addresses of the flash memory 43. In addition, the second microcontroller 42 also manages metadata about the file system per se.

In order to avoid conflicts in the case of parallel access to the file system, the protocol used by the second microcontroller 42 merely includes atomic operations. Each operation is atomic insofar as it affects at least one entire block of the file system provided by microcontroller 42. In the exemplary embodiment, the second microcontroller 42 provides a so-called FAT file system in which individual blocks have sizes of 512 bytes. To implement the atomic write and read operations, a block with up to 512 bytes of payload is read or written with each bus transaction. Furthermore, as described with reference to FIG. 6, parallel access by different function modules 13 is avoided.

The second microcontroller 42 is also used to implement the block size of the file system used to the deviating size of the storage disk of the flash memory 43 in the exemplary embodiment. In the exemplary embodiment, the flash memory 43 is segmented into blocks of 4 KB of data, which in each case can only be deleted together. To implement these different block sizes, the microcontroller 42 has a buffer 81 in which multiple blocks of the file system can be buffered.

Upon implementation of operations by the microcontroller 42, said controller also considers the fact that unwritten parts of data blocks of a FAT file system are typically padded with the logical value "0" Conversely, each memory cell is typically padded with the logic value "1" in a flash memory 43 after deleting a memory block. Therefore, the microcontroller 42 inverts all bits of data exchanged via the system management bus 36 in a flash memory 43, after deleting a memory block, to avoid unnecessary programming operations. This data inversion is completely transparent to a server module 22 connected to the system management bus 36.

When reading the flash memory 43, in each case an entire block from the flash memory is read into the buffer 81. Subsequent reading operations via the system management bus 36, which relate to subsequent blocks of the file system, can thus be answered directly from the buffer 81.

In the writing direction, the buffer 81 is faced with a further task. Flash memories 43 basically allow only a limited number of deletion and subsequent write operations. Therefore, the method described below is used to reduce the number of deletion and write operations required during the operation of the computer system 1.

FIG. 8 shows a flowchart of a method for overwriting a data block in the flash memory 43. In a first step S41, a write command is received via the system management bus 36. Based on the path indication in the write command received in step S41, a corresponding memory block of the flash memory 43 is determined in step S42. To that end, metadata stored in the flash memory 43 or a working memory of the microcontroller 42 are used, for example, about the file system managed by the microcontroller 42. If an assigned memory block has been determined in step S42, its content is read into the buffer 81 in a step S43. The data read in the buffer 81 are overwritten completely or partially according to the write command in a step S44. Since, in the exemplary embodiment, a 4 KB block is always read in from the flash memory 43, while a maximum of 512 data bytes are changed with each write operation, the exemplary embodiment is always only a partial overwrite of the data stored in the buffer 81.

In a step S45, it is verified whether the data contained in the buffer 81 is identical to the data stored in the corresponding block of the flash memory 43. If this is the case, because only the same configuration data is to be saved again in the flash memory 43 for example, in fact no data change was caused by the write operation so that the method can be terminated without further action. If, in contrast, it is determined in step S45 that at least some of the data of the buffered data block have changed, it is verified, in a further step S46, whether the changes merely affected the transition from unprogrammed values, i.e. the logical value 1, to programmed values, i.e. the logical value 0, of the flash memory 43. If this is the case, for example, since only additional Ones have been set in the configuration data contained in the system management bus 36, only the bits of the corresponding memory block of the flash memory 43 whose values have been set to a programmed value are overwritten in a step S47. If, however, it is determined in step S46 that changes are required from a programmed state to an unprogrammed state of the flash memory 43, the entire assigned block of the flash memory 43 is deleted in a step S48. In a subsequent step S49, the entire block stored in the buffer 81 is written again into the corresponding block of the flash memory 43.

By the method described herein, write and delete operations for the non-volatile flash memory 43 are avoided to the greatest possible extend. Thereby, in particular the number of delete operations in the flash memory 43 is reduced to such an extent that typically all changes on configuration data which are to be expected during the operation of the modular computer system 1 can be stored and recalled in the flash memory 43 without errors.

In addition, the implementation of the FAT file system by the second microcontroller 42 allows for a particularly flexible control of the flash memory 43. Accordingly, firmware components of the individual server modules can address the flash memory 43 using symbolic names and, if required, also exchange configuration data with other server modules 22.

FIGS. 9 and 10 show the sequence of two atomic bus transactions for reading or writing data via the system management bus 36.

According to FIG. 9, the second microcontroller 42 is addressed in a first bus cycle by indicating a corresponding address of the I$^2$C bus. The latter then confirms the incoming inquiry. The function module 13 then transmits its own node number. In the exemplary embodiment, the node number is the logical address of a computer node of one of the server modules 22 in one of the receiving bays 7a to 7d. In the exemplary embodiment, four logical computer nodes are provided for each physical receiving bay 7a to 7d so that a total of 16 different node numbers can be assigned. After confirming the node number, the actual command, here a read operation, is transmitted and confirmed. In the subsequent two bytes, the number of data to be read is transmitted. In the following four bus cycles, an offset is indicated in the file to be read. Here, the file name of the file to be read is indicated in the following 32 bus cycles. In this case, the file name can contain both path indications and the file name itself in the so-called eight-plus-three format, i.e. the so-called FAT-16 format. Unused bytes of the file name of up to 32 bytes are padded with a predetermined character, in particular the value "0." In a subsequent bus cycle, a checksum, in particular a CRC8 checksum regarding the recently transmitted data, is transmitted. Thereafter, the roles of sender and receiver change with regard to the system management bus 36.

After checking the transmitted data, the second microcontroller 42 determines, based on stored metadata of the file system, a corresponding memory block of the flash memory 43 and reads the requested data into the buffer 81. As a result, the microcontroller 42 returns a status of the read operation to the function module 13 which confirms it. Subsequently, the number of valid data bytes is then transmitted to the function module and verified with a checksum, in this example again with a CRC8 checksum. In the subsequent bus cycles, a maximum of 512 bytes of data from the requested data block will be transmitted. Upon completion of the data transmission, a checksum is transmitted again regarding the previously transmitted data. If necessary, so-called dummy cycles are subsequently transmitted in order to compensate for a possible difference between transmitted data and requested data before the bus transaction is terminated in a final step.

The write operation shown in FIG. 10 is performed in an equivalent manner. Here, the function module 13 obviously assumes the provision of data, while the microcontroller 42 merely confirms the number of successfully written data bytes and transmits a checksum for the verification of the transaction back to the function module 13.

LIST OF REFERENCE NUMERALS

1 modular computer system
 2 chassis
 3 fastening tab
 4 control panel
 5 group of storage plugins
 6 perforated rails
 7 receiving bay (for function module)
 8 additional receiving bay (for power supply unit)
 9 first circuit board
 10 second circuit board
 11 PCB connector
 12 cooling device
 13 function module
 14 storage plugin
 15 power supply unit
 16 connecting structure
 17 module connector
 18 (corresponding) connector
 19 copper plate
 20 third circuit board
 21 copper rails
 22 server module
 23 processor
 24 bank
 25 first configuration
 26 second configuration
 27 third configuration
 28 fourth configuration
 31 chassis interface unit
 32 system management module
 33 first interface module
 34 IPMB bus system
 35 second interface module
 36 system management bus
 37 ambient temperature sensor
 39 chassis FRU memory
 40 light path controller
 41 first microcontroller (for the control panels)
 42 second microcontroller (for the flash memory)
 43 flash memory
 44 third microcontroller (for the cooling devices)
 45 serial bus system
 46 control circuit
 47 serial bus system
 80 SPI-interface
 81 buffer
 S41 to S49 process steps

The invention claimed is:

1. Modular computer system comprising:
 a chassis with a plurality of receiving bays for receiving a plurality of server modules;
 a non-volatile memory device arranged in the chassis; and
 at least one controller arranged in the chassis and connected to the memory device;
 wherein
 the memory device stores configuration data of the plurality of server modules, the configuration data including at least one of BIOS settings and network settings; and
 upon receiving a request for writing the configuration data from one of the plurality of server modules received in the receiving bay, the controller maps the request on an address space of the memory device and transmits at least one corresponding control command to the memory device.

2. Modular computer system according to claim 1, wherein the controller is connected to the non-volatile memory device via a first serial bus system.

3. Modular computer system according to claim 2, wherein
 each of the receiving bays has at least one terminal electrically connected to the at least one controller for the electrical contacting of a server module accommodated in the respective receiving bay;
 the at least one controller is connected to the terminals via a at least one second serial bus system for the transmission of configuration data to the server modules accommodated in the receiving bays; and
 the at least one second serial bus system is configured to prevent the simultaneous transmission of configuration data through different server modules.

4. Modular computer system according to claim 2, wherein the at least one controller is connected to the memory device via a Serial Peripheral Interface (SPI) bus.

5. Modular computer system according to claim 2, wherein the at least one controller is connected to the terminals via at least one of an inter-integrated circuit (I²C) bus or a system management bus (SMB).

6. Modular computer system according to claim 1, wherein
 the memory device provides a plurality of memory blocks for storing data;
 the at least one controller provides a file system for access to the memory device by means of path and/or file names; and
 the at least one controller is configured to map path and/or file names received by the plurality of server modules accommodated in the receiving bays on blocks of the memory device assigned to the path and/or file names.

7. Modular computer system according to claim 6, wherein a first function server accommodated in a first receiving bay is configured to exchange configuration data with a second server module accommodated in a second receiving bay via the file system.

8. Modular computer system according to claim 6, wherein the at least one controller implements a protocol with atomic operations for access to the configuration data stored in the file system through the plurality of server modules accommodated in the receiving bays, wherein each operation is atomic insofar as the operation affects at least one entire memory block of the file system provided by a microcontroller, such that the protocol ensures atomic access to individual elements of the file system.

9. Modular computer system according to claim 8, wherein the protocol is configured for atomic transmission of data blocks of a predetermined size and validation data assigned to the data blocks.

10. Modular computer system according to claim 1, wherein
the memory device comprises a programmable read only memory, in particular a flash memory, whose memory cells have a first logic value in the unprogrammed state;
the at least one controller is configured to invert data bits of configuration data received from the plurality of server modules accommodated in the receiving bays in such a way that data bits of the received configuration data are mapped with a second logic value on memory cells of the memory device in the unprogrammed state.

11. Modular computer system according to claim 10, wherein the programmable read only memory can only be erased in blocks and the at least one controller has a buffer for buffering at least one data block of the programmable read only memory and is configured to,
upon reception of a request to write configuration data, to load into the buffer configuration data contained in the request and/or a memory block of the memory device assigned to the request;
compare the configuration data to be written with the data from the assigned memory block;
discard the request for writing configuration data without intermediate deletion or the writing of the configuration data to be written, if the comparison showed that the buffered data block identically contains the configuration data to be written.

12. Modular computer system according to claim 11, wherein the at least one controller is further configured to
overwrite the assigned data block with the configuration data to be written without intermediate deletion, if the comparison showed that exclusively transitions from the first logic value corresponding to an unprogrammed state to the second logic value corresponding to a programmed state for writing the configuration data into the programmable read only memory are required; and
to erase the assigned data block and subsequently write the configuration data to be written thereon, if the comparison showed that at least one transition from the second logic value to the first logic value is necessary to write configuration data in the programmable read only memory.

13. Server module for use in a modular computer system with a controller and a memory device, comprising:
at least one system board for the reception of system components;
at least one module connector for the electrical contacting of the modular computer system; and
at least one firmware component for storing and retrieving configuration data, the configuration data including at least one of BIOS setting and network settings;
wherein the at least one firmware component is configured to transmit the configuration data to be stored via the module connector to the controller of the modular computer system and to retrieve configuration data to be retrieved via the module connector from the controller of the modular computer system.

14. Server module according to claim 13, wherein the at least one firmware component is configured to save configuration data using path and/or file names in a file system or to retrieve it from the file system.

15. Server module according to claim 13, wherein the at least one firmware component is configured to at least one of store and retrieve configuration data using atomic operations according to a protocol of the controller, wherein each operation is atomic insofar as the operation affects at least one entire block of the file system provided by a microcontroller.

16. Server module according to claim 13, comprising at least one system management module connected to the module connector via a serial system management bus and configured to execute the at least one firmware component in order to exchange configuration data with the controller via the system management bus.

17. Server module according to claim 16, wherein the system management module is configured, upon recognition of simultaneous use of the system management bus (36) by another bus user, to interrupt an exchange of configuration data and to restart said exchange after a predetermined waiting time.

18. Modular computer system, comprising:
a chassis with a plurality of receiving bays for receiving a corresponding plurality of function modules;
a non-volatile memory device arranged in the chassis; and
at least one controller arranged in the chassis and connected to the memory device;
wherein
the memory device stores configuration data of the plurality of function modules, the configuration data including at least one of BIOS setting information and network settings; and
upon receiving a request for writing the configuration data from one of the plurality of function modules receiving in the receiving bay, the at least one controller maps the request on an address space of the memory device and transmits at least one corresponding control command to the memory device.

19. Modular computer system according to claim 18, wherein the at least one controller is connected to the memory device via a Serial Peripheral Interface (SPI) bus and the at least one controller is connected to a plurality of terminals arranged in the plurality of receiving bays via an inter-integrated circuit (I$^2$C) bus or a system management bus (SMB) for the transmission of configuration data to the function modules accommodated in the receiving bays and connected to the respective terminals.

20. Modular computer system according to claim 18, wherein
the memory device provides a plurality of memory blocks for storing data;
the at least one controller provides a file system for access to the memory device by means of path and/or file names; and
the controller is configured to map path and/or file names received by the function modules accommodated in the receiving bays on blocks of the memory device assigned to the path and/or file names.

* * * * *